United States Patent
Song et al.

(10) Patent No.: US 9,905,761 B2
(45) Date of Patent: Feb. 27, 2018

(54) ORGANIC LIGHT EMITTING DISPLAY DEVICE HAVING SUBSIDIARY LAYERS TO ADJUST A RESONANT RANGE, AND METHOD OF FABRICATING THE SAME

(71) Applicant: SAMSUNG DISPLAY CO., LTD., Yongin, Gyeonggi-Do (KR)

(72) Inventors: JungBae Song, Seongnam-si (KR); Seonju Kim, Seoul (KR); Young-Rok Song, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 15 days.

(21) Appl. No.: 14/793,195

(22) Filed: Jul. 7, 2015

(65) Prior Publication Data
US 2016/0133840 A1 May 12, 2016

(30) Foreign Application Priority Data

Nov. 12, 2014 (KR) .................. 10-2014-0157425

(51) Int. Cl.
*H01L 27/32* (2006.01)
*H01L 51/50* (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
CPC ............. H01L 27/3211; H01L 27/3216; H01L 27/3218; H01L 51/5008
See application file for complete search history.

(56) References Cited

U.S. PATENT DOCUMENTS

| 2009/0026921 A1* | 1/2009 | Kuma | ................ H01L 51/5265 |
| | | | 313/504 |
| 2013/0001532 A1* | 1/2013 | Hwang | ............... H01L 51/0058 |
| | | | 257/40 |

(Continued)

FOREIGN PATENT DOCUMENTS

| JP | 2009-158881 A | 7/2009 |
| JP | 2010-280066 A | 12/2010 |

(Continued)

OTHER PUBLICATIONS

English machine translation of JP2009-158881A of record.*

*Primary Examiner* — Tom Thomas
*Assistant Examiner* — Christopher M Roland
(74) *Attorney, Agent, or Firm* — Lee & Morse, P.C.

(57) ABSTRACT

Disclosed is an organic light emission display device including; a substrate in which a first side area, a middle area, and a second side are sequentially defined in a first direction; a first electrode disposed on the substrate; a second electrode opposite to the first electrode; a red emission layer disposed between the first and second electrodes; a first subsidiary layer disposed between the red emission layer and the first electrode in the middle area, and configured to adjust a resonant range; and a second subsidiary layer disposed between the red emission layer and the first electrode respectively in the first and second side areas, and configured to adjust a resonant range. The first subsidiary layer is different from the second subsidiary layer in thickness.

10 Claims, 6 Drawing Sheets

(51) Int. Cl.
    *H01L 51/00*     (2006.01)
    *C23C 14/24*     (2006.01)
    *C23C 14/04*     (2006.01)
    *C23C 14/12*     (2006.01)
    *H01L 51/52*     (2006.01)

(52) U.S. Cl.
    CPC ........ *C23C 14/243* (2013.01); *H01L 27/3211* (2013.01); *H01L 27/3216* (2013.01); *H01L 51/5008* (2013.01); *H01L 51/5265* (2013.01); *H01L 27/3218* (2013.01)

(56) References Cited

U.S. PATENT DOCUMENTS

| | | | |
|---|---|---|---|
| 2014/0097414 A1* | 4/2014 | Kim | H01L 51/0003 257/40 |
| 2014/0319483 A1* | 10/2014 | Moon | H01L 27/3241 257/40 |
| 2015/0001480 A1* | 1/2015 | Kim | H01L 51/5265 257/40 |
| 2016/0204370 A1* | 7/2016 | Park | H01L 51/5004 257/40 |
| 2016/0218154 A1* | 7/2016 | Pyo | H01L 27/3211 |

FOREIGN PATENT DOCUMENTS

| | | |
|---|---|---|
| KR | 10-2011-0021623 A | 3/2011 |
| KR | 10-2011-0120213 A | 11/2011 |
| KR | 10-2012-0011611 A | 2/2012 |
| KR | 10-2012-0132177 A | 12/2012 |

\* cited by examiner

ORGANIC LIGHT EMITTING DISPLAY DEVICE HAVING SUBSIDIARY LAYERS TO ADJUST A RESONANT RANGE, AND METHOD OF FABRICATING THE SAME

CROSS-REFERENCE TO RELATED APPLICATION

Korean Patent Application No. 10-2014-0157425, filed on Nov. 12, 2014, in the Korean Intellectual Property Office, and entitled: "Organic Light Emission Display Device, and Method and Thin Film Deposition Apparatus of Fabricating the Same," is incorporated by reference herein in its entirety.

BACKGROUND

1. Field

Embodiments relate a thin film deposition apparatus, an organic light emission display device fabrication method therewith, and an organic light emission display device, and more particularly, relate to a thin film deposition apparatus, an organic light emission display device fabrication method therewith, and an organic light emission display device, improving display quality.

2. Description of the Related Art

Organic light emission display devices, as kinds of self-luminous display units, are superior to others in response rates, view angles, and contrast ratios, as well as advantageous for power consumption because those can be enabled to operate without additional light sources. On the merits, such organic light emission display devices are sprightly enhancing industrial interests thereto for mobile display devices such as digital cameras, video cameras, camcorders, portable digital assistants, smart phones, ultra-slim laptop computers, tablet personal computers, or flexible display units, and large-sized electronic/electric products such as ultra-thin television sets.

The organic light emission display device operates to express image colors in the mechanism of emitting light by recombining holes and electrons, which are injected into first and second electrodes, in an organic light emission layer, for which the light is emitted when excitons generated by the combination with holes and electrons transition to the ground state from the excited state.

SUMMARY

Embodiments are directed to an organic light emission display device, including a substrate in which a first side area, a middle area, and a second side are sequentially defined in a first direction, a first electrode disposed on the substrate, a second electrode opposite to the first electrode, a red emission layer disposed between the first and second electrodes, a first subsidiary layer disposed between the red emission layer and the first electrode in the middle area, and configured to adjust a resonant range, and a second subsidiary layer disposed between the red emission layer and the first electrode respectively in the first and second side areas, and configured to adjust a resonant range, the first subsidiary layer being different from the second subsidiary layer in thickness.

The first subsidiary layer may be thicker than the second subsidiary layer.

The first side area, the middle area, and the second side area may extend toward a second direction intersecting the first direction.

The first side area may occupy 10% of the substrate, the middle area may occupy 80% of the substrate, and the second side area may occupy 10% of the substrate.

Embodiments are also directed to a method of fabricating an organic light emission display device, the method including preparing a substrate in which a first side area, a middle area, and a second side area are sequentially defined in a first direction, placing a mask, which is smaller than the substrate, on the substrate, forming a first subsidiary layer on the middle area by means of the mask, forming a second subsidiary layer, which is different from the first subsidiary layer in thickness, in the first and second side areas by means of the mask, and forming a red emission layer on the first and second subsidiary layers.

One of the substrate and the mask may shift toward a second direction intersecting the first direction, and the mask may be used to form the first and second subsidiary layers.

The mask may have first slits formed in a first domain corresponding to a position of the middle area, and second slits formed in a second domain corresponding to positions of the first and second side areas, and lengths of the first and second slits may contribute to adjust an amount of an evaporation material passing through the mask to form the first and second subsidiary layers.

The first subsidiary layer may be formed thicker than the second subsidiary layer.

As a distance from the center of the mask increases, the first slits may become longer and the second slits become shorter, and an amount of the evaporation material interrupted by the mask may depend on the lengths of the first and second slits, the second subsidiary layer being formed thinner than the first subsidiary layer.

The first subsidiary layer may be formed at the same time as the second subsidiary layer.

Embodiments are also directed to a thin film deposition apparatus forming a film on a substrate where a first side area, a middle area and a second side area are sequentially defined in a first direction, the thin film deposition apparatus including an evaporator configured to radiate an evaporation material, and a mask disposed over the evaporator and configured to allow the evaporation material to pass, the mask including first slits disposed in a first domain corresponding to a position of the middle area and configured to be longer as a distance from the center of the mask increases, and second slits disposed in a second domain corresponding to positions of the first and second side areas and configured to be shorter as a distance from the center of the mask increases.

The first and second slits may extend toward a second direction intersecting the first direction.

The mask may be shorter than the substrate in the second direction.

The thin film deposition apparatus may further include a uniformity adjusting plate disposed in the first domain and configured to partly interrupt the evaporation material to uniform a thickness of a film deposited on the middle area, and a thickness adjusting plate disposed in the second domain and configured to partly interrupt the evaporation material to differentiate a film, which is deposited on the first and second side areas, from the film of the middle area in thickness.

The uniformity adjusting plate may be integrated with the thickness adjusting plate.

The uniformity and thickness adjusting plates may be respectively integrated with the mask, and the uniformity adjusting plate may be configured to control the first slits by length and the thickness adjusting plate is configured to control the second slits by length.

One aspect of embodiments is directed to provide an organic light emission display device improved in display quality.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
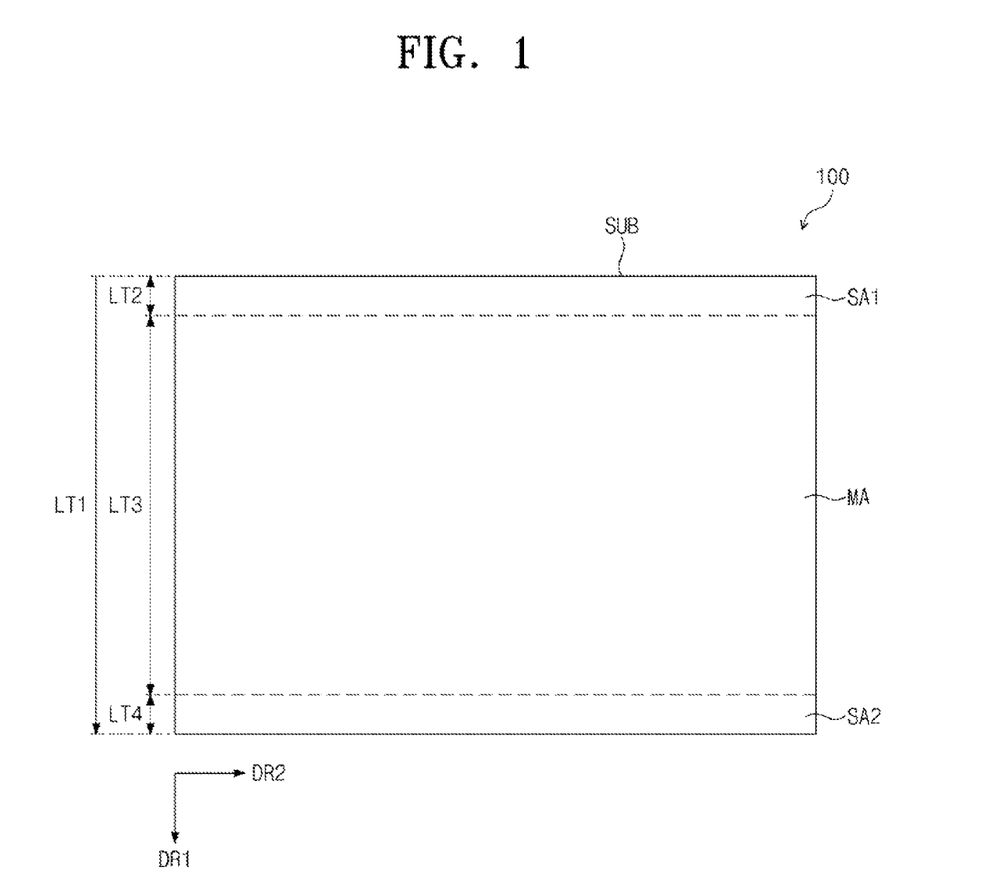
FIG. 1 illustrates a rear view illustrating an organic light emission display device according to an example embodiment.
Figure 2:
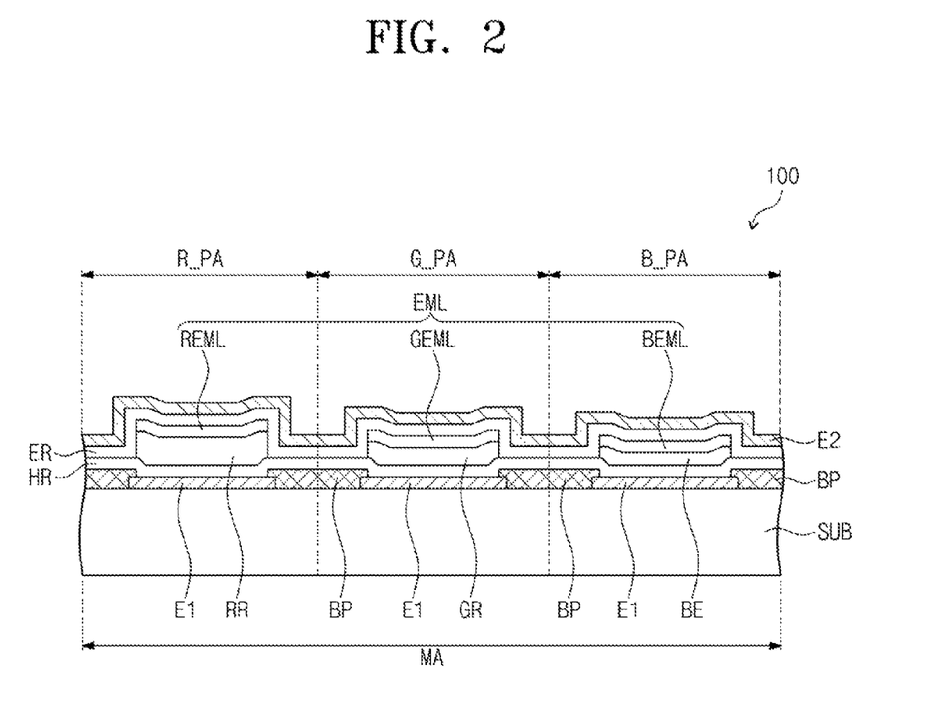
FIG. 2 illustrates a sectional view illustrating red, green and blue pixel areas of the organic light emission display device.

FIG. 1 is a rear view illustrating an organic light emission display device (hereinafter referred to as 'OLED') according to an example embodiment, and FIG. 2 is a sectional view illustrating red, green and blue pixel areas of the OLED.

Referring to FIGS. 1 and 2, the OLED 100 includes a substrate SUB.

The substrate SUB may be made of an insulator such as glass, plastic, crystal, etc. The substrate SUB may be made of an organic polymer. The organic polymer forming the substrate SUB may be exemplified as polyethylene terephthalate (PET), polyethylene naphthalate (PEN), polyimide, polyethersulfone, and so on. A material for the substrate SUB may be adopted to consider mechanical strength, thermal stability, transparency, surface levelness, handling convenience, water resistance, and so on.

The substrate SUB may be shaped in a rectangular plate with two elongated sides extending toward a second direction DR2 that intersects a first direction DR1. In the present example embodiment, the first direction DR1 may be orthogonal to the second direction DR2 and the pair of sides extending toward the second direction DR2 may be longer than a pair of sides extending toward the first direction DR1.

The substrate SUB may be defined with a first side area SA1, a middle area MA, and a second side area SA2 in sequence. The first side area SA1, the middle area MA and the second side area SA2 may extend respectively toward the second direction DR2.

Defining a length of the substrate SUB in the first direction DR1 as a first length LT1, in the present example embodiment, a second length LT2 of the first side area SA1 in the first direction DR1 may be one-tenth of the first length LT1, a third length LT3 of the middle area MA in the first direction DR1 may be eight-tenths of the first length LT1, and a fourth length LT4 of the second side area SA2 in the first direction DR1 may be one-tenth of the first length LT1. Therefore, the first side area SA1 may occupy 10% of the substrate SUB, the middle area MA may occupy 80% of the substrate SUB, and the second side area SA2 may occupy 10% of the substrate SUB.

On the substrate SUB may be included driving thin film transistors, and switching thin film transistors for switching the driving thin film transistors. The driving thin film transistor may include a gate electrode, a source electrode, and a drain electrode. The drain electrode may be connected with a first electrode E1.

The first electrode E1 may be prepared in plurality in each pixel area. The first electrode E1 may act as a pixel electrode or an anode. The first electrode E1 may be a transmissive, semi-transmissive, or reflective type. If the first electrode E1 is a transmissive one, it may be formed of a transparent metal oxide such as indium oxide (ITO), indium zinc oxide (IZO), zinc oxide (ZnO), indium tin zinc oxide (ITZO), or so forth. If the first electrode E1 is a semi-transmissive or reflective one, it may include As, Mg, Al, Pt, Pd, Au, Ni, Nd, Ir, Cr, or a metallic compound.

The first electrode E1 may be structured in a single or multiple layers formed of a transparent metal oxide or a metal. For instance, the first electrode E1 may be structured in a single layer with ITO, Ag, or a metallic compound (e.g. a compound of Ag and Mg), in double layers with ITO/Ag or ITO/MgF, or in triple layers with ITO/Ag/ITO, but should not be restricted thereto.

At the edge of the first electrode E1 may be placed a pixel insulation film BP. The pixel insulation film BP may confine the pixel areas, and contain an organic, inorganic, or organic/inorganic composite insulation material, such as silicide.

On a plurality of the first electrodes E1 may be disposed a hole transport region HR in common. The hole transport region HR may include at least one of a hole injection layer, a hole transport layer, a buffer layer, and an electron blocking layer.

The hole transport region BR may be structure in a single layer with a unitary material, in a single layer with a plurality of different materials, or in multiple layers with a plurality of different materials.

For example, the hole transport region HR may be structured in a single layer with plural different materials, or in stacked layers of, being deposited from the first electrode E1 in sequence, the hole injection layer—the hole transport layer, the hole injection layer—the transport layer—the buffer layer, the hole injection layer—the buffer layer, the hole transport layer—the buffer layer, or the hole injection layer—the hole transport layer—the electron blocking layer, but should not be restricted thereto.

The hole transport region HR may be formed by various processing operations such as vacuum deposition, spin coating, casting, Langmuir-Blodgett (LB), inkjet printing, laser printing, Laser Induced Thermal Imaging (LITI), etc.

If the hole transport region HR includes the hole injection layer, the hole transport region HR may contain: a phthalocyanine compound such as copper phthalocyanine; N,N'-diphenyl-N,N'-bis-[4-(phenyl-m-tolyl-amino)-phenyl]-biphenyl-4,4'-diamine (DNTPD); 4,4',4''-tris(3-methyphenylphenylamine) (m-MTDATA); 4,4',4''-tris(N,N-diphenylamino)triphenylamine (TDATA); 4,4',4''-tris {N-(2-naphthyl)-N-phenylamino}-triphenylamine (2TNATA); poly(3,4-ethylenedioxythiophene)/poly(4-styrenesulfonate) (PEDOT/PSS); polyaniline/dodecylbenzenesulfonic acid (PANI/DBSA); polyaniline/camphor sulfonic acid (PANI/CSA); polyaniline/poly(4-styrenesulfonate (PANI/PSS); and so on, but should not be restricted thereto.

If the hole transport region HR includes the hole transport layer, the hole transport region HR may contain: carbazole-based derivatives such as N-phenylcarbazole, polycarbazole, etc.; fluorine-based derivatives; triphenylamine-based derivatives such as N,N'-bis(3-methylpheny)-N,N'-diphenyl-[1,1-biphenyl]-4-4'-diamine (TPD), 4,4',4''-tris(N-carbazolyl)triphenylamine (TCTA), etc.; N-N'-di(1-naphthyl)-N,N'-diphenylbenzidine (NPB); 4,4'-cyclohexylidene bis[N,N-bis(4-methyphenyl)benzenamine] (TAPC); and so on, but should not be restricted thereto.

A thickness of the hole transport region HR may be ranged in 100 Å~10000 Å, for example, in 100 Å~1000 Å. If the hole transport region HR includes both the hole injection layer and the hole transport layer, a thickness of the hole injection layer may be ranged in 100 Å~10000 Å, for example, in 100 Å~1000 Å, and a thickness of the hole transport layer may be ranged in 50 Å~2000 Å, for example 100 Å~1500 Å. If the hole transport region HR, the hole injection layer and the hole transport layer meet the condition of thickness ranges, it is possible to obtain sufficient functionality of hole transportation without substantial drive voltage elevation.

The hole transport region HR may further contain a charge generation material, in addition the aforementioned materials, in order to enhance its conductivity. This charge generation material may be distributed in the hole transport region HR uniformly or irregularly. The charge generation material may be p-dopants. These p-dopants may be ones of quinine-based derivatives, metallic compounds, and cyanic compounds, but should not be restricted thereto. There are non-restricted examples for the p-dopants, e.g. quinone-based derivatives such as tetracyanoquinodimethane (TCNQ) and 2,3,5,6-tetrafluoro-tetracyanoquinodimethane (FA-TCNQ), and metallic oxides such as tungsten oxides and molybdenum oxides, but should not be restricted thereto.

As aforementioned, the hole transport region HR may further include at least one of the buffer layer and the electron blocking layer in addition to the hole injection and transport layers. The buffer layer may function to increase light emission efficiency by compensating resonant ranges of light radiated from a light emission layer. A material contained in the buffer layer may be same with that containable in the hole transport region HR. The electron blocking layer functions to impede electron injection from an electron transport region ER.

On the hole transport region HR is disposed an light emission layer EML. The light emission layer EML may be structured in a single layer with a unitary material, a single layer with a plurality of different materials, or multiple layers with a plurality or different materials.

The light emission layer EML may be formed by way of various operations such as vacuum deposition, spin coating, casting, LB, inkjet printing, LITI, and so on.

Although not restricted to usual matters, the light emission layer EML may consist of substances emitting red, green, and blue, containing fluorescent and phosphorescent ingredients. Additionally, the light emission layer EML may include hosts and dopants.

Although not restricted thereto, the host may be adopted from: Alq3(tris(8-hydroxyquinolino)aluminum); 4,4'-bis(N-carbazolyl)-1,1'-biphenyl (CBP); poly(n-vinylcarbazole) (PVK); 9,10-di(naphthalene-2-yl)-anthracene (AND); 4,4', 4"-tris(carbazole-9-yl)-triphenylamine (TCPA); 1,3,5-tris (N-phenylbenzimidazole-2-yl)benzene (TPBi); 3-tert-butyl-9,10-di(naphtha-2-yl)anthracene (TBADN); distyrylarylene (DSA); 4,4'-bis(9-carbazolyl)-2,2'-dimethyl-biphenyl (CDBP); and 2-methyl-9,10-bis(naphthalene-2-yl)anthracene (MADN).

A red emission layer REML disposed in a red pixel area R_PA of the light emission layer EML may contain a fluorescent material including, e.g., tris(dibenzoylmethanato)phenanthroline europium (PBD:Eu(DBM)$_3$)Phen) or perylene. The dopants included in the red emission layer REML may be adopted from metal complexes or organic metal complexes, e.g., bis(1-phenylisoquinoline)acetylacetonate iridium (PIQIr(acac)), bis(1-phenylquinoline)acetylacetonate iridium (PQIr(acac), tris(1-phenylquinoline) iridium (PQIr), and octaethylporphyrin platinum (PtOEP).

Between the red emission layer REML and the hole transport region HR may be disposed a subsidiary layer RR. The subsidiary layer RR may act to provide a resonant range so as to make light be output with its maximum efficiency by the principle of constructive interference. The subsidiary layer RR may contain the materials included in the hole transport region HR, but should not be restricted thereto. The subsidiary layer RR may be structured in a single layer, or in multiple layers containing different materials. In the present example embodiment, a thickness of the subsidiary layer RR may be variable in accordance with its level of the substrate SUB, which will be further described later with reference to FIG. 3.

A green emission layer GEML disposed in a green pixel area G_PA of the light emission layer EML may contain a fluorescent material, e.g., including tris(8-hydroxyquinolino)aluminum (Alq$_3$). The green emission layer GEML may include dopants adopted from metal complexes or organic metal complexes, e.g., fac-tris(2-phenylpyridine)iridium (Ir (ppy)$_3$).

Between the green emission layer GEML and the hole transport region HR may be disposed a subsidiary layer GR. Like the subsidiary layer RR placed under the red emission layer REML, the subsidiary layer GR may also act to provide a resonant range so as to light be output with its maximum efficiency. Differently, in another embodiment, the subsidiary later GR may be omitted.

A blue emission layer BEML disposed in a blue pixel region B_PA of the light emission layer EML may contain a fluorescent material including one selected from a group of, e.g., polymers based on Spiro-DPVBi, spiro-6P, distryryl benzene (DSB), distryryl arylene (DSA), polyfluorene (PFO), and poly(p-phenylene vinylene) (PPV). The blue emission layer BEML may contain dopants selected from metal complexes or organic metal complexes, e.g., (4,6-F2ppy)$_2$Irpic.

Between the blue emission layer BEML and the hole transport region HR may be disposed an efficiency-improving layer BE. The efficiency-improving layer BE may be a functional layer helping to enhance emission efficiency and lifetime of red light. In another embodiment, this efficiency-improving layer BE may be omitted.

On the light emission layer EML may be disposed the electron transport region ER. The electron transport region ER may include at least one of the hole blocking layer, the electron transport layer, and the electron injection layer, but should not be restricted thereto.

For example, the electron transport region ER may be structured in a sequential stack of the electron transport layer—the electron injection layer, or the hole blocking layer—the electron transport layer—the electron injection layer, or in a single mixed layer with two or more layers.

The electron transport region ER may be formed by way of various operations such as vacuum deposition, spin coating, casting, LB, inkjet printing, laser printing, LITI, and so on.

If the electron transport region ER includes the electron transport layer, the electron transport region ER may contain: tris(8-hydroxyquinolinato)aluminum (Alq3); 1,3,5-tri (1-phenyl-1H-benzo[d]imidazol-2-yl)phenyl (TPBi); 2,9-dimethyl-4,7-diphenyl-1,10-phenanthroline (BCP); 4,7-diphenyl-1,10-phenanthroline (Bphen); 3-(4-biphenylyl)-4-phenyl-5-tert-butylphenyl-1,2,4-triazole (TAZ); 4-(naphthalene-1-yl)-3,5-diphenyl-4H-1,2,4-triazole (NTAZ); 2-(4-biphenylyl)-5-(4-tert-butylphenyl)-1,3,4-oxadiazole (tBu-PBD); bis(2-methyl-8-quinolinolato-N1,08)- (1.1'-biphenyl-4-olato)aluminum (BAla); beryllium-bis (benzoquinolin-10-olate) (Bebq2); 9-10-di(naphthalene-2-yl)anthracene (AND); and a compound with them, but should not be restricted thereto. The electron transport layer may have a thickness ranging from 100 Å to 1000 Å, e.g., 150 Å~500 Å. If the electron transport layer meets the aforementioned ranges in thickness, it is attainable to obtain the desired characteristics for electron transportation without substantial drive voltage elevation.

If the electron transport region ER includes the electron injection layer, the electron transport region ER may be used with a lanthanum group metal such as LiF, LiQ (lithium quinolate), Li$_2$O, BaO, NaCl, CsF, and Yb, or a halide metal such as RbCl and RbI, but should not be restricted thereto. The electron injection layer may include a mixed material with an electron transport matter, and an organic metal salt that is insulating. The organic metal salt may be a material that is about 4 eV or more in energy band gap. For instance, in detail, the organic metal salt may contain metal acetate, metal benzoate, metal acetoacetate, metal acetylacetonate, or metal stearate. The electron injection layer may have a thickness ranging about from 1 Å to 100 Å, e.g., 3 Å~90 Å. If the electron injection layer meets this range in thickness, it is attainable to obtain the desired characteristics of electron injection without substantial drive voltage elevation.

As aforementioned, the electron transport region ER may include the hole blocking layer. The hole blocking layer may contain at least one of, e.g., 2,9-dimethyl-4,7-diphenyl-1, 10-phenanthroline (BCP) and 4,7-diphenyl-1,10-phenanthroline (Bphen), but should not be restricted thereto. The hole blocking layer may have a thickness ranging about from 20 Å to 1000 Å, e.g., 30 Å~300 Å. If the hole blocking layer meets this range in thickness, it is attainable to obtain the high hole blocking characteristics without substantial drive voltage elevation.

On the electron transport region ER may be disposed a second electrode E2. The second electrode E2 may be a common electrode or a cathode. The second electrode E2 may be a transparent, semi-transparent, or reflective one. If the second electrode E2 is a transparent one, the second electrode E2 may contain Li, Ca, LiF/Ca, LiF/Al, Al, Mg, Ag, or a compound or mixture (e.g. a mixture with Ag and Mg) of them.

The second electrode E2 may include a subsidiary electrode. The subsidiary electrode may contain a film and a transparent metal oxide layer. The film is disposed on the light emission layer, and the film may contain Li, Ca, LiF/Ca, LiF/Al, Al, Mg, Ag, or a compound or mixture (e.g.

a mixture with Ag and Mg) of them. The transparent metal oxide layer is disposed on the film, and the transparent metal oxide layer may contain such as ITO, IZO, ITZO, and so on. If the second electrode E2 is a semi-transparent or reflective one, the second electrode E2 may contain Ag, Mg, Al, Pt, Pd, Au, Ni, Nd, Ir, Cr, Li, Ca, LiF/Ca, LiF/Al, or a compound or mixture (e.g. a mixture of Ag and Mg) with them. Otherwise, the second electrode E2 may be structured in a plurality of layers including a reflective or semi-transparent film, which is made of such a material, and a transparent conductive film made of IZO, ZnO, ITZO, etc.

If the organic light emission device is a front emitting type, the first electrode E1 may be a reflective one and the second electrode E2 may be a transparent or semi-transparent one. If the organic light emission device is a rear emitting type, the first electrode E1 may be a transparent or semi-transparent one and the second electrode E2 may be a reflective one.

Figure 3:
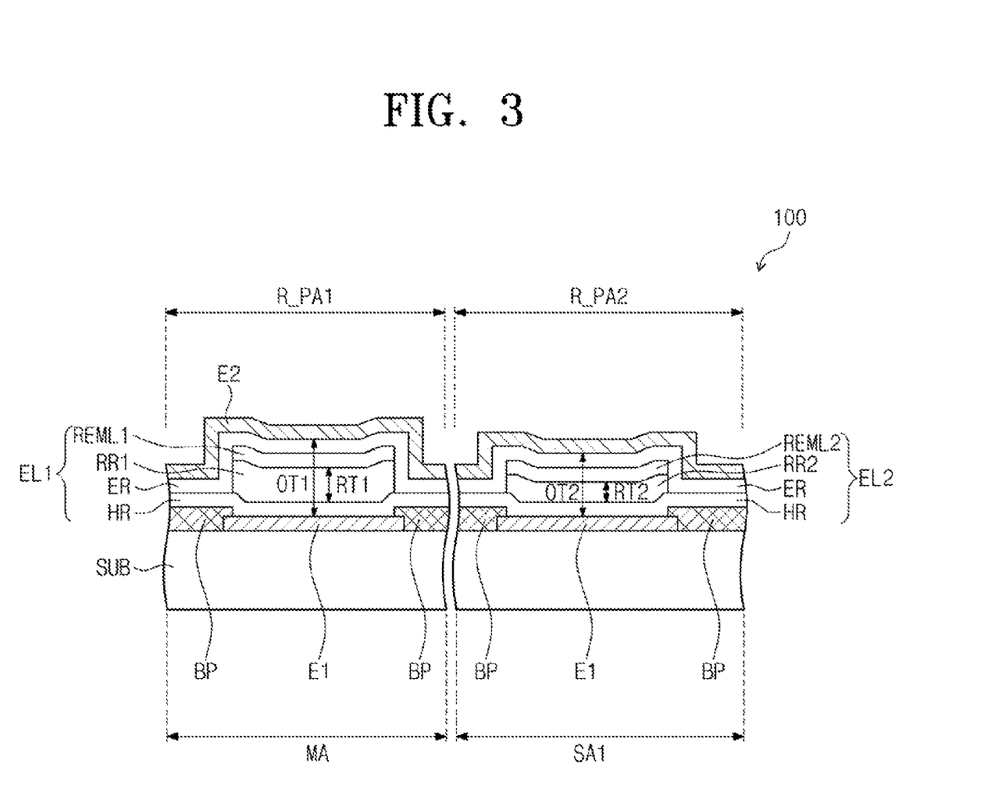
FIG. 3 illustrates a sectional view illustrating red pixel areas respective to the middle area and the first side area.

FIG. 3 is a sectional view illustrating red pixel areas respective to the middle area and the first side area. In describing the feature shown in FIG. 3, the same components aforementioned in conjunction with FIG. 2 will be referred to the same reference marks and will not be further stated.

In FIG. 3 are shown a first red pixel area R_PA1 of the middle area MA, and a second red pixel area R_PA2 of the first side area SA1. As a third red pixel area of the second side area (SA2 of FIG. 1) is similar to the second red pixel area R_PA2, the third red pixel area will not be further described.

In the first red pixel area R_PA1 may be disposed the first electrode E1, a first red organic layer EL1, and the second electrode E2, in sequence. The first red organic layer EL1 may include the hole transport region HR, a first subsidiary layer RR1, a first red emission layer REML1, and the electron transport region ER.

In the second red pixel area R_PA2 may be disposed the first electrode E1, a second red organic layer EL2, and the second electrode E2, in sequence. The second red organic layer EL2 may include the hole transport region HR, a second subsidiary layer RR2, a second red emission layer REML2, and the electron transport region ER.

As an example with the first red pixel area R_PA1, the red (i.e. red or reddish light) emitted from the first red emission layer REML1 may resonate between the first and second electrodes E1 and E2 and then output to the outside. During this, if there is constructive interference of the red resonating between the first and second electrodes E1 and E2, it is accomplishable to more enhance emission efficiency and luminance of the red. In order to secure a resonant range between the first and second electrodes E1 and E2, the first subsidiary layer RR1 may be disposed between the first red emission layer REML1 and the hole transport region HR.

If the first red organic layer EL1 and the second red organic layer EL2 are deposited by way of the scanning method, it would happen thereto a reddish effect that causes pictures to be reddened in the first and second side areas SA1 and SA2. This reddish effect arises from a variation in resonant course of output light by a change of view angle in accordance with observers' view points. That is, if the resonant course varies, a color of output light is altered. Since in the substrate SUB, the first and second side area (SA1 and SA2 of FIG. 1) are more variable than the middle area MA in resonant course, such a reddish effect would be more prominent in the first and second side areas (SA1 and SA2 of FIG. 1). According to embodiments, the reddish effect can be prevented by differentiating the second subsidiary layer RR2, which is disposed over the first and second side areas (SA1 and SA2 of FIG. 1), from the first subsidiary layer RR1 of the middle area MA in thickness.

Depending on the thicknesses of the first and second subsidiary layers RR1 and RR2, the resonant ranges are variable in first and second red pixel areas R_PA1 and R_PA2. Therefore, adjusting thicknesses of the first and second subsidiary layers RR1 and RR2 changes color coordinates values of the red emitted respectively from the first and second red pixel areas R_PA1 and R_PA2. In other words, adjusting a thickness of the second subsidiary layer RR2 may modify red coordinates of light emitted from the second red pixel area R_PA2, thereby reducing the reddish effect that depends on a change of view angle and hence improving expression quality of the OLED 100.

In the present example embodiment, a first thickness RT1 of the first subsidiary layer RR1 may be larger than a second thickness RT2 of the second subsidiary layer RR2. For example, the first thickness RT1 may be larger than the second thickness RT2 by about 50 Å. The first subsidiary layer RR1 may be 580 Å through 620 Å in thickness, for example 600 Å. The second subsidiary layer RR2 may be 540 Å through 570 Å, for example 550 Å.

Since the first subsidiary layer RR1 is different from the second subsidiary layer RR2 in thickness, a first resonant range OT1 of the first red pixel area R_PA1 may be unequal to the second resonant range OT2 of the second red pixel area R_PA2. For instance, the first resonant range OT1 may be 2980 Å through 3020 Å, for example 3000 Å. The second resonant range OT2 may be 2930 Å through 2970 Å, for example 2950 Å.

Since the first resonant range OT1 is different from the second resonant range OT2, the color coordinates values of the red emitted from the first and second red pixel areas R_PA1 and R_PA2 may be unequal each other. Therefore, controlling a thickness of the second subsidiary layer RR2 is contributory to adjust color coordinates values of the red, thus preventing the reddish effect from arising in the first side area SA1 and the second side area (SA2 of FIG. 1).

While this example embodiment is shown as the first thickness RT1 of the first subsidiary layer RR1 is larger than the second thickness RT2 of the second subsidiary layer RR2, another example embodiment may be implemented as the first thickness RT1 of the first subsidiary layer RR1 is smaller than the second thickness RT2 of the second subsidiary layer RR2. This will be more described in detail by FIG. 4.

Figure 4:
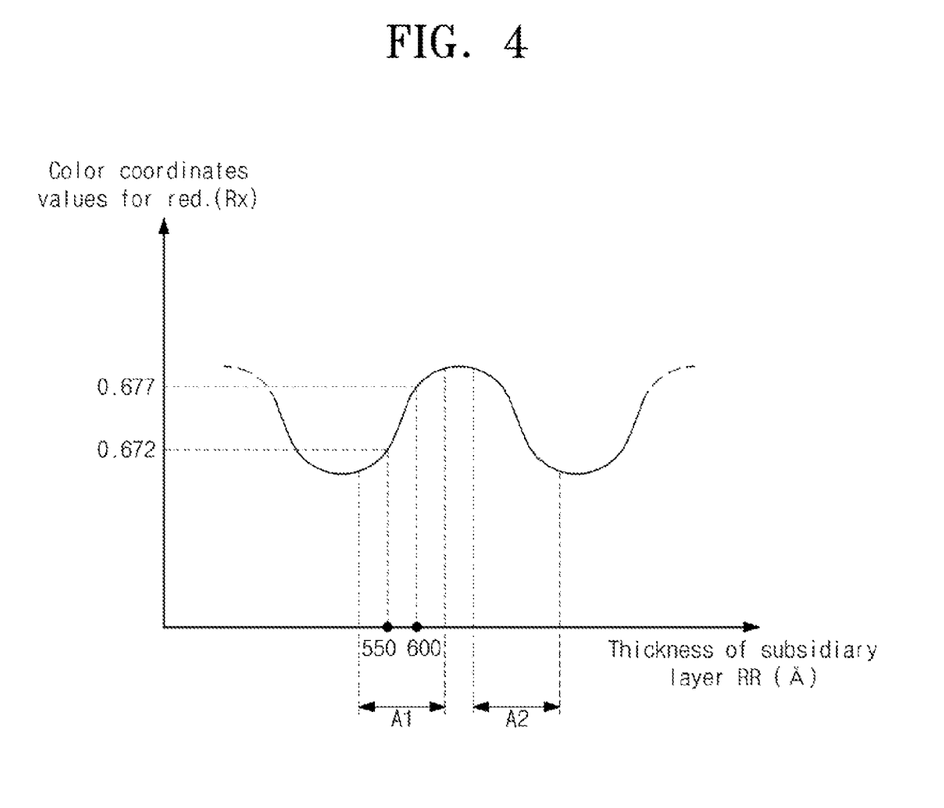
FIG. 4 illustrates a graph schematically showing variations of color coordinates values with thicknesses of the subsidiary layers disposed in the red pixel areas.

FIG. 4 is a graph schematically showing variations of color coordinates values with thicknesses of the subsidiary layers disposed in the red pixel areas.

Referring to FIG. 4, the graph plots color coordinates values Rx of the red emitted from the red pixel area R_PA, varying in accordance with a thickness of the subsidiary layer RR of FIG. 2. Since a resonant range changes depending on the thickness of the subsidiary layer RR, the color coordinates values Rx can be variable.

For example, in a first interval Al, as large as the thickness of the subsidiary layer RR, the color coordinates value Rx goes to be higher. By comparison, in a second interval A2, as large as the thickness of the subsidiary layer RR, the color coordinates value Rx goes to be lower. If the color coordinates value Rx becomes lower, the red can be thinner in optical density.

The first thickness (RT1 of FIG. 3) of the first subsidiary layer (RR1 of FIG. 3) and the second thickness (RT2 of FIG. 3) of the second subsidiary layer (RR2 of FIG. 3), described by FIG. 3, may be ranked within the first interval Al.

Therefore, for the purpose of lessening the reddish effect occurring in the first and second side areas (SA1 and SA2 of FIG. 1), it is permissible to reduce the second thickness (RT2 of FIG. 3) of the second subsidiary layer (RR2 of FIG. 3).

In more detail, if the first thickness (RT1 of FIG. 3) is 600 Å, the red emitted from the first red pixel area R_PA1 may appear with 0.677 as its color coordinates value Rx. If the second thickness (RT2 of FIG. 3) is 550 Å, the red emitted from the second red pixel area R_PA2 may appear with 0.672 as its color coordinates value Rx. In other words, the red emitted from the second red pixel area R_PA2 may be thinner than the red emitted from the first red pixel area R_PA1 in optical density. As a result, it is attainable to diminish the reddish effect in the first and second side areas (SA1 and SA2 of FIG. 1).

In another embodiment, if the thicknesses of the first and second subsidiary layers (RR1 and RR2 of FIG. 3) are ranked within the second interval A2, different from the aforementioned, the first thickness (RT1 of FIG. 3) may be smaller than the second thickness (RT2 of FIG. 3). Since in the second interval A2 the color coordinates value Rx becomes smaller as the subsidiary layer RR becomes thicker, the second thickness (RT2 of FIG. 3) may be larger than the first thickness (RT1 of FIG. 3), hence improving effects due to the reddish effect arising the first and second side areas (SA1 and SA2 of FIG. 1).

Figure 5:
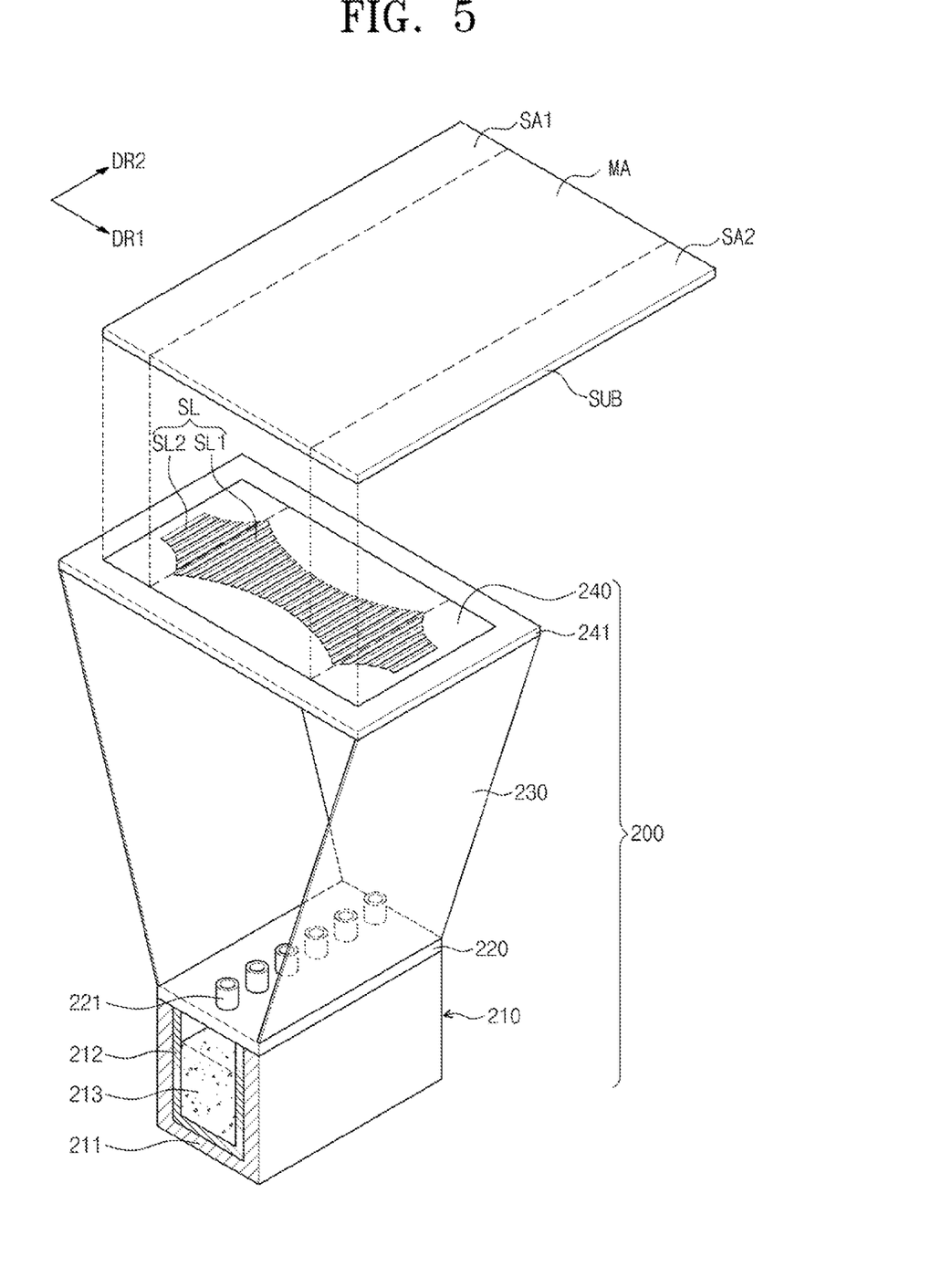
FIG. 5 illustrates a perspective view schematically illustrating a thin film deposition apparatus according to an example embodiment.
Figure 6:
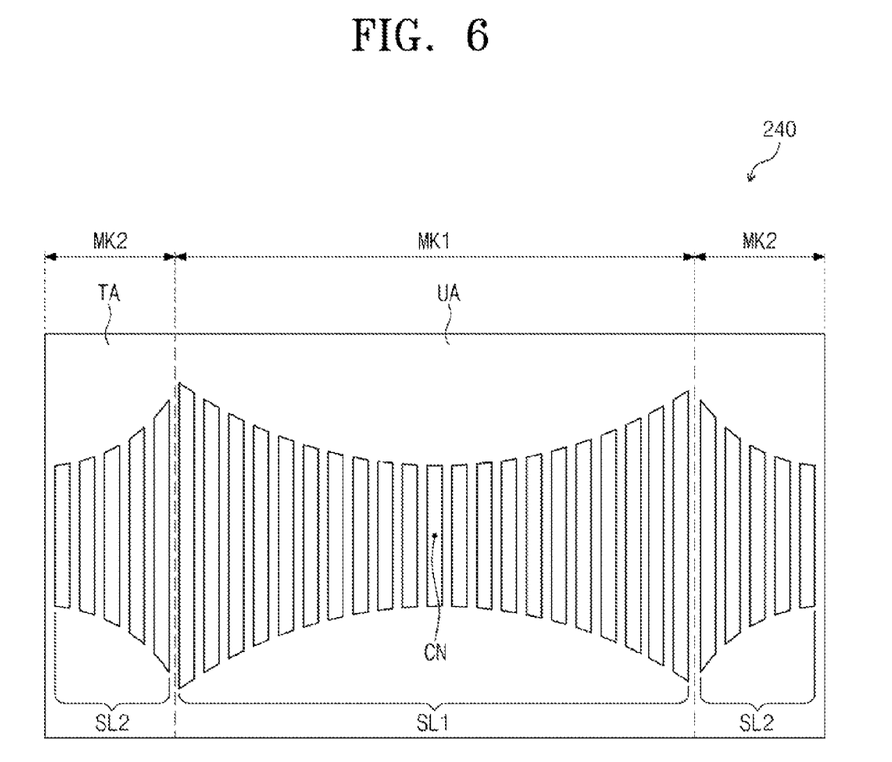
FIG. 6 illustrates a plan view illustrating a mask of FIG. 5.

FIG. 5 is a perspective view schematically illustrating a thin film deposition apparatus according to an example embodiment, and FIG. 6 is a plan view illustrating a mask of FIG. 5. While a chamber is not illustrated in FIG. 5 for the sake of descriptive convenience, all of the components shown in FIG. 5 may be placed in the chamber that is conditioned at a suitable vacuum.

Referring to FIGS. 5 and 6, the thin film deposition apparatus 200 may include an evaporator 210, an evaporator nozzle portion 220, and a mask 240.

The evaporator 210 may include a crucible 211 in which a evaporation material 213 is charged, and a heater 212 vaporizing the evaporation material 213 to the evaporator nozzle portion 220 from the inside of the crucible 211.

The evaporator nozzle portion 220 may be placed at the side looking to the substrate SUB of the evaporator 210. In the evaporator nozzle portion 220, a plurality of nozzles 221 may be arranged in the second direction DR2, i.e. along the scanning direction of the substrate SUB.

Between the evaporator 210 and the substrate SUB may be disposed the mask 240 and a frame 241. The frame 241 may be formed with its center that is shaped as an open frame, the center of which may be coupled with the mask 240.

The mask 240 may be smaller than the substrate SUB in size. For instance, if the evaporative deposition is proceeding in the progressive scanning mode while shifting one of the substrate SUB and the thin film deposition apparatus 200 along the second direction DR2, the mask 240 may be shorter than the substrate SUB in the second direction DR2. This small size of the mask 240 may facilitate the manufacturing process. The mask 240 smaller than the substrate SUB, relative to a case of the same size with the substrate SUB, may be more profitable for facilitating various processing operations such as etching, subsequent fine tension and welding, shifting and cleaning, and so on.

The mask 240 may have a first domain MK1 corresponding to the position of the middle area MA, and a second domain MK2 corresponding to the positions of the first and second side areas SA1 and SA2.

The mask 240 may include slits SL extending toward the second direction DR2. The slits SL may be classified into first slits SL1 arranged in the first domain MK1, and second slits SL2 arranged in the second domain MK2. As a distance from the center CN of the mask 240 increases, the first slits SL1 may be longer, in a longitudinal direction, while the second slits SL2 may be shorter.

A film deposited by the thin film deposition apparatus 200 would be deposited thickly at the position corresponding to the center CN of the mask 240, then the section of which could be protuberant. To uniformly form a thickness of the film, the evaporation material bounding toward the middle area MA may be partly interrupted. For that reason, the first slits SL1 are formed shorter near the center CN of the mask 240, helping to provide a uniform thickness of the first subsidiary layer (RR1 of FIG. 3).

The mask 240 may include a uniformity adjusting plate UA to control lengths of the first slits SL1 while meeting the first slits SL1. In the present example embodiment, the uniformity adjusting plate UA may be integrated with the mask 240 in one body. In another embodiment, the uniformity adjusting plate UA may be disposed between the mask 240 and the substrate SUB, and between the mask 240 and the evaporator 210, to partly block the evaporation material 213. Therefore, it may be used to adjust and correct an amount of deposition so as to uniform the thickness of the first subsidiary layer (RR1 of FIG. 3).

In the present example embodiment, for the purpose of lessening the reddish effect arising from the first and second side areas SA1 and SA2, the second subsidiary layer (RR2 of FIG. 3) on the first and second side areas SA1 and SA2 may be deposited thinner than the first subsidiary layer (RR1 of FIG. 3) on the middle area MA. Therefore, by shortening the second slits SL2 as far as distant from the center CN of the mask 240, it is possible to interrupt a part of the evaporation material 213.

The mask 240 may include a thickness adjusting plate TA to control lengths of the second slits SL2 while meeting the second slits SL2. The thickness adjusting plate TA may be integrated with the uniformity adjusting plate UA, in one body, and also integrated with the mask 240. While in this example embodiment the thickness adjusting plate TA is integrated with the mask 240, another example embodiment may be implemented to dispose the thickness adjusting plate TA between the mask 240 and the substrate SUB or between the mask 240 and the evaporator 210 to partly interrupt the evaporation material 213.

By depositing a thin film with the mask 240 according to the present example embodiment, the first subsidiary layer (RR1 of FIG. 3) may be uniformly formed on the middle area MA, improving display quality. Additionally, the second subsidiary layer (RR2 of FIG. 3) deposited on the first and second side areas SA1 and SA2 may be thinner than the first subsidiary layer (RR1 of FIG. 3) deposited on the middle area MA. Consequently, the reddish effect may be diminished in the first and second side areas SA1 and SA2, thus enhancing display quality.

Additionally, the mask 240 according to this example embodiment may be used as a single mask to coincidently form the first and second subsidiary layer (RR1 and RR2 of FIG. 3), which are different each other in thickness, easily.

The evaporator 210 may be coupled with the mask 240 by way of a joint member 230. In other words, the evaporator 210, the evaporator nozzle portion 220 and the mask 240 are coupled each other by means of the joint member 230 to form an integrated body. The joint member 230 may guide the evaporation material 213, which is exhausted from the evaporator nozzles 221, in a route to the deposition target, preventing the evaporation material 213 from dispersing. Otherwise, in another embodiment, the joint member 230 may be formed in a sealed box.

As described above, according to embodiments, the first subsidiary layer disposed in the middle area of the substrate may be different in thickness from the second subsidiary layer disposed on the first and second side areas of the substrate. Adjusting a thickness of the second subsidiary layer may be used to control color coordinates values of red light emitted respectively from the first and second side areas, thus reducing the reddish effect to improve display quality of the OLED.

In addition, according to embodiments, the thin film deposition apparatus may include the mask which has the first and second slits. The first slits become longer, as a distance from the center of the mask increases, while the second slits become shorter. The first slits enable the first subsidiary layer to be deposited with a uniform thickness in the middle area. The second slits enable the second subsidiary layer to be formed different from the first subsidiary layer in thickness. Using the mask equipped with the first and second slits, it may be possible to easily form at the same time the first and second subsidiary layers which are different each other in thickness.

As described above, embodiments may provide a method of fabricating an organic light emission display device with higher display quality. Embodiments may provide a thin film deposition apparatus for fabricating a high-quality organic light emission display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular example embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emission display device, comprising:
a substrate in which a first side area, a middle area, and a second side are sequentially defined in a first direction;
a first electrode disposed on the substrate;
a hole transport region disposed on the first electrode;
an electron transport region disposed on the hole transport region;
a second electrode opposite to the first electrode and disposed on the electron transport region;
a red emission layer disposed between the hole transport region and the electron transport region;
a first subsidiary layer disposed between the red emission layer and the hole transport region in the middle area, and configured to adjust a resonant range; and
a second subsidiary layer disposed between the red emission layer and the hole transport region respectively in the first and second side areas, and configured to adjust a resonant range, the first subsidiary layer being different from the second subsidiary layer in thickness,
wherein:
each of the first and second subsidiary layers is disposed in a closed space defined by the hole transport region and the electron transport region, wherein, in defining the closed space, the electron transport region contacts first and second sides of each of the first and second subsidiary layers, the electron transport region contacts the hole transport region adjacent to the first and second sides, and the hole transport region extends along third sides of the respective first and second subsidiary layers between the first and second sides.

2. The organic light emission display device as claimed in claim 1, wherein the first subsidiary layer is thicker than the second subsidiary layer.

3. The organic light emission display device as claimed in claim 1, wherein the first side area, the middle area, and the second side area extend toward a second direction intersecting the first direction.

4. The organic light emission display device as claimed in claim 1, wherein the first side area occupies 10% of the substrate, the middle area occupies 80% of the substrate, and the second side area occupies 10% of the substrate.

5. A method of fabricating an organic light emission display device, the method comprising:
preparing a substrate in which a first side area, a middle area, and a second side area are sequentially defined in a first direction;
forming a first electrode on the substrate
forming a hole transport region on the first electrode;
placing a mask, which is smaller than the substrate, on the substrate opposite to the hole transport region;
forming a first subsidiary layer on the hole transport region in the middle area by means of the mask;
forming a second subsidiary layer, which is different from the first subsidiary layer in thickness, on the hole transport region in the first and second side areas by means of the mask;
forming a red emission layer on the first and second subsidiary layers; and
forming an electron transport region on the red emission layer and the hole transport region; and
forming a second electrode opposite to the first electrode, the second electrode being disposed on the electron transport region, wherein,
the red emission layer is disposed between the hole transport region and the electron transport region,
the first subsidiary layer is disposed between the red emission layer and the hole transport region in the middle area, and is configured to adjust a resonant range,
the second subsidiary layer is disposed between the red emission layer and the hole transport region respectively in the first and second side areas, and is configured to adjust a resonant range, and
each of the first and second subsidiary layers is disposed in a closed space defined by the hole transport region and the electron transport region, wherein, in defining the closed space, the electron transport region contacts first and second sides of each of the first and second subsidiary layers, the electron transport region contacts the hole transport region adjacent to the first and second sides, and the hole transport region extends along third sides of the respective first and second subsidiary layers between the first and second sides.

6. The method as claimed in claim 5, wherein one of the substrate and the mask shifts toward a second direction intersecting the first direction, and the mask is used to form the first and second subsidiary layers.

7. The method as claimed in claim 6, wherein:
the mask has first slits formed in a first domain corresponding to a position of the middle area, and second slits formed in a second domain corresponding to positions of the first and second side areas, and
lengths of the first and second slits contribute to adjust an amount of an evaporation material passing through the mask to form the first and second subsidiary layers.

8. The method as claimed in claim 7, wherein the first subsidiary layer is formed thicker than the second subsidiary layer.

9. The method as claimed in claim 8, wherein:
as a distance from the center of the mask increases, the first slits become longer and the second slits become shorter, and
an amount of the evaporation material interrupted by the mask depends on the lengths of the first and second slits, the second subsidiary layer being formed thinner than the first subsidiary layer.

10. The method as claimed in claim 5, wherein the first subsidiary layer is formed at the same time as the second subsidiary layer.

\* \* \* \* \*